United States Patent
Zhao et al.

(10) Patent No.: US 6,614,307 B1
(45) Date of Patent: Sep. 2, 2003

(54) HYBRID STRUCTURE FOR DISTRIBUTED POWER AMPLIFIERS

(75) Inventors: Lei Zhao, Chandler, AZ (US); Anthony M. Pavio, Paradise Valley, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/211,825

(22) Filed: Aug. 2, 2002

(51) Int. Cl.[7] .................................................. H03F 3/60
(52) U.S. Cl. ........................................ 330/286; 330/307
(58) Field of Search ............................ 330/286, 295, 330/302, 307, 124 R, 65, 66, 67, 68

(56) References Cited

U.S. PATENT DOCUMENTS

| | | | | |
|---|---|---|---|---|
| 3,495,183 A | * | 2/1970 | Doundoulakis et al. | 330/54 |
| 4,446,445 A | * | 5/1984 | Apel | 330/269 |
| 4,540,954 A | * | 9/1985 | Apel | 330/286 |
| 5,117,207 A | * | 5/1992 | Powell et al. | 333/1 |

* cited by examiner

Primary Examiner—Henry Choe
(74) Attorney, Agent, or Firm—Douglas W. Gilmore; Barbara R. Doutre

(57) ABSTRACT

A hybrid low voltage distributed power amplifier structure (300) provides improved efficiency by forming drain transmission line inductors (323) on a substrate (306) while the rest of the amplifier is built in IC form (302). A wirebond interconnection (330) is made between the IC's drainline capacitors (324) and the substrate's drainline inductors (323) which are a higher impedance point in the circuit. As a result, the wirebond inductance becomes negligible and has little or no impact on the power amplifier's performance.

13 Claims, 4 Drawing Sheets

HYBRID STRUCTURE FOR DISTRIBUTED POWER AMPLIFIERS

FIELD OF THE INVENTION

This invention relates generally to power amplifiers and more specifically to hybrid structures for distributed power amplifiers.

BACKGROUND OF THE INVENTION

Low voltage power amplifiers are used in a variety of applications including radio and cellular handsets as well as wireless broadband applications to name a few. The term hybrid structure typically refers to passive circuit elements formed on non-semiconductor substrates combined with semiconductors. Hybrid structures are often used in the design of low voltage distributed power amplifier (PA) circuits because of the low cost properties of the structure. FIG. 1 shows a schematic 100 of a distributed power amplifier 102 integrated as a single chip coupled to balun/transformer 104 on a ceramic substrate 106. The substrate 106 is typically formed using Low Temperature Cofired Ceramics Technology (LTCC). The distributed power amplifier 102 includes an input 108, a plurality of transistors 110, here shown as field effect transistors (FETs) each having drain 112, gate 114 and source 116, and an output 118. Amplifier 102 further includes gate transmission line 120 having gateline inductors 121 as well as drain transmission line 122 having drainline inductors 123, along with drainline capacitors 124, and termination resistors 126, 128.

Traditionally, the distributed power amplifier 102 has been built with both the gate transmission line 120 and the drain transmission line 122 integrated on the power amplifier IC chip 102. The connection to the rest of the circuit is accomplished with wirebonds 130 at the output 118 of the power amplifier chip 102. For a low voltage power amplifier, the output 118 of the PA 102 is a low impedance point (3 to 4 ohm). Thus, the wirebond inductance significantly degrades the performance of the amplifier 102 since the inductive reactance of the wirebonds 130 is a large percentage of the total load impedance.

FIG. 2 shows a graph 200 of gain (dB) 202, output power (Pout, dBm) 204 and power-added efficiency (PAE%) 206 versus frequency (GHz). Graph 200 is based on a simulation for a five-cell PHEMT (Pseudomorphic High Electron Mobility) transistor, drain-tapered, distributed amplifier with 1 watt output power with the wirebonds 130 connecting the IC 102 and the LTCC substrate 106 as shown in FIG. 1. Power amplifier efficiency is a design parameter of considerable interest, and circuit designers are constantly seeking ways of improving the efficiency which in turn translates into longer battery life for portable products.

Accordingly, it would be desirable to have a power amplifier structure that is less susceptible to the wirebonds so as to have less impact on impedance and thereby provide improved efficiency.

BRIEF DESCRIPTION OF THE DRAWINGS

The present invention is illustrated by way of example and not limitation in the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Figure 3:
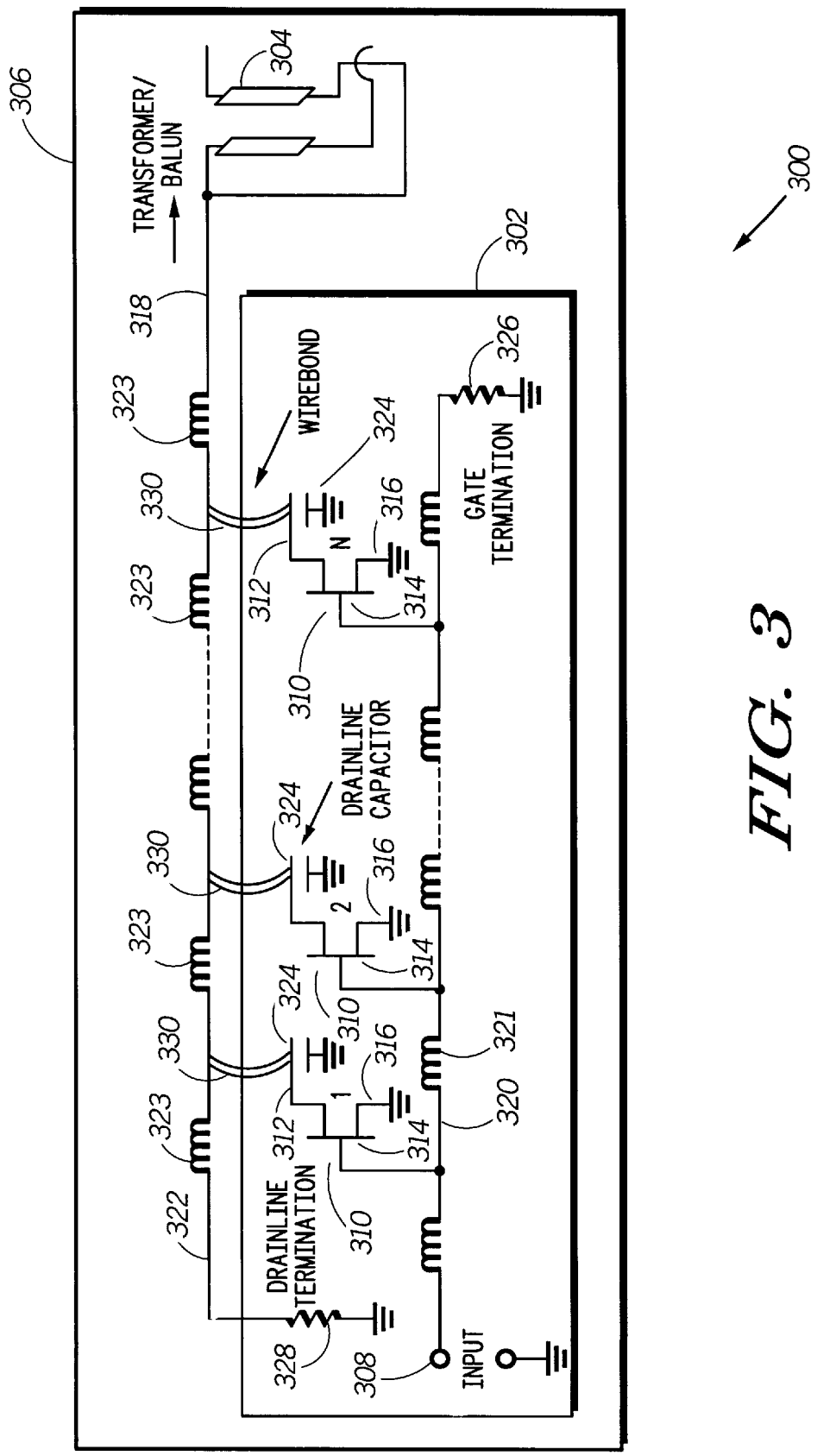
FIG. 3 is a schematic diagram of a power amplifier in accordance with the present invention.

FIG. 3 shows a schematic 300 for a distributed power amplifier 302 formed in accordance with the present invention, the power amplifier being coupled to a load, such as a transformer/balun 304. In accordance with the present invention, drain transmission line inductors 323 and output 318 are built in the ceramic substrate 306, and the rest of the amplifier 302 is built in IC form. Thus, the IC portion of power amplifier 302 includes an input 308, a plurality of transistors 310, here shown as N-channel FETs each having drain 312, gate 314 and source 316. The IC portion of amplifier 302 further includes gate transmission line 320, gate transmission line inductors 321, drainline capacitors 324, and termination resistors 326, 328.

In accordance with the present invention, wirebond interconnection 330 is made between the drainline capacitors 324 and drainline inductors 323, which is a higher impedance point in the circuit. By moving the wirebond interconnection point to a higher impedance point in the circuit, the wirebond inductance will not introduce performance degradation typically caused by dynamic load errors. As a result, the wirebond inductance becomes negligible and has little or no impact on the power amplifier's performance.

Figure 1:
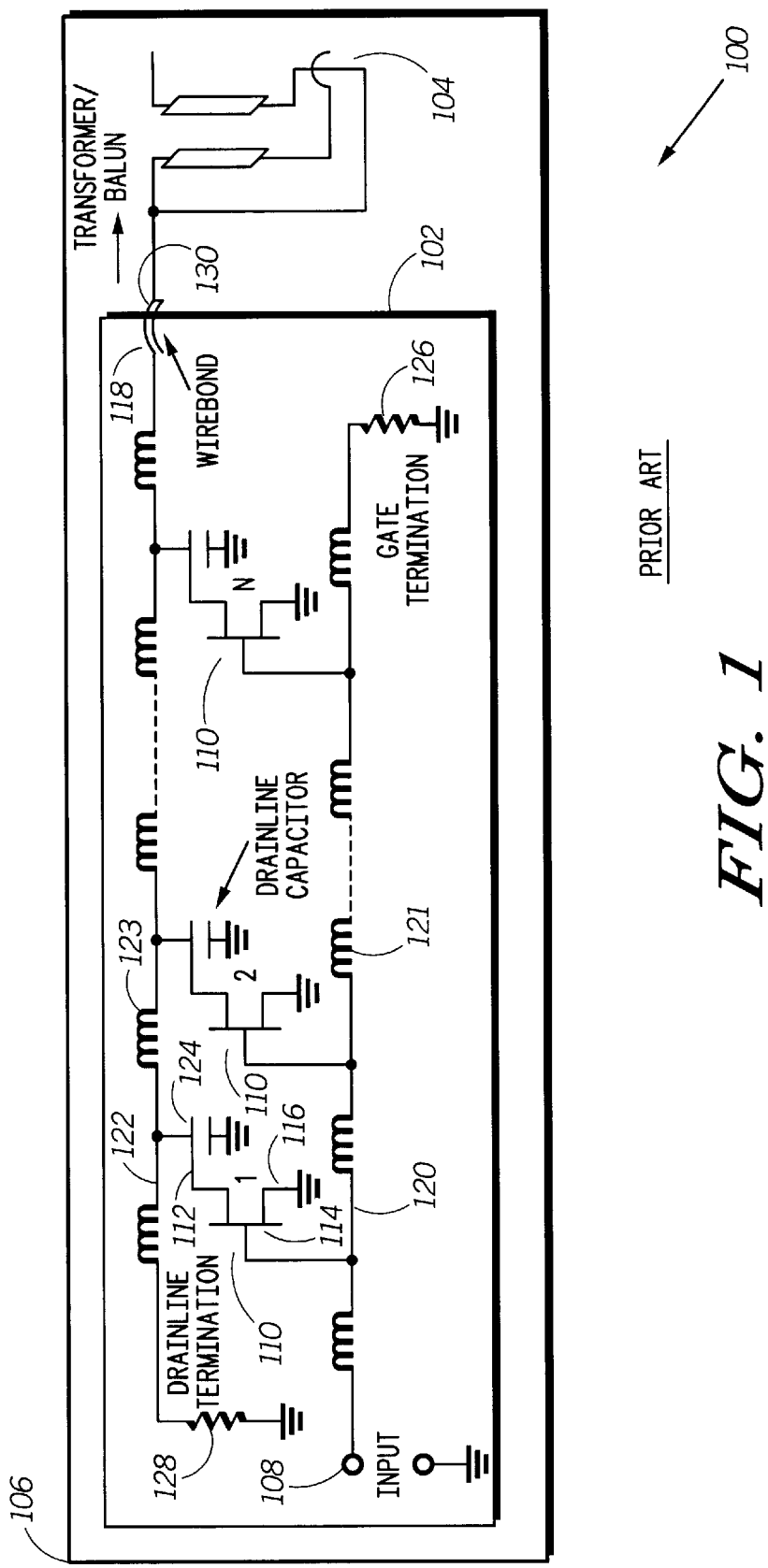
FIG. 1 is a schematic diagram of a power amplifier in accordance with the prior art.
Figure 2:
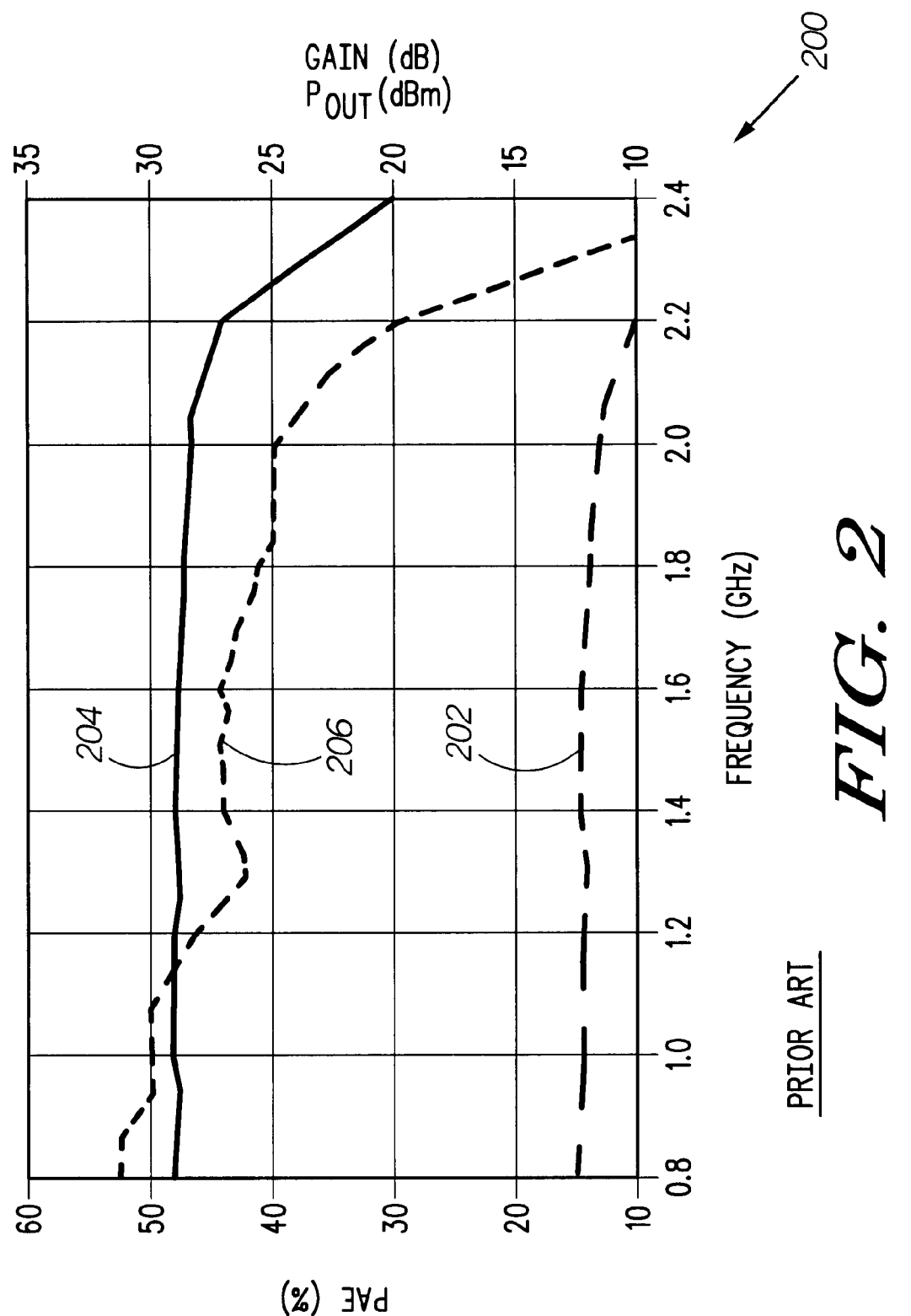
FIG. 2 is a graph of gain and output power and power-added efficiency versus frequency in accordance with the prior art.
Figure 4:
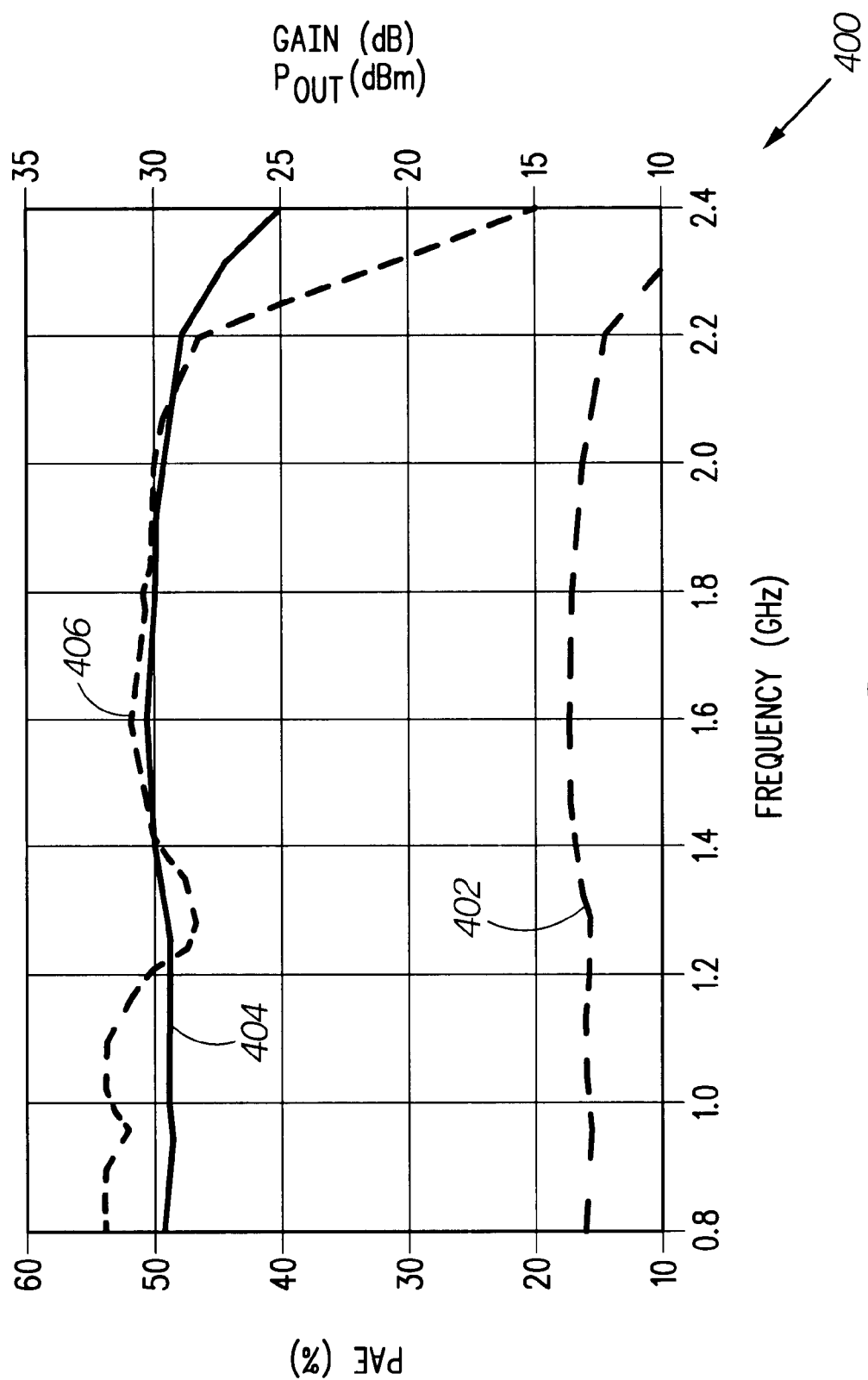
FIG. 4 is a graph of gain and output power and power-added efficiency versus frequency in accordance with the present invention.

FIG. 4 is a graph of gain (dB), output power (Pout, dBm) and power-added efficiency (PAE%) versus frequency (GHz) achieved for a hybrid structure formed in accordance with the present invention. The same parameters were used in the simulation of FIG. 4 as that in FIG. 2 except that the drainline transmission inductors were integrated onto the substrate 306 and wirebonded out from the PA to the inductive points. FIG. 4 shows significant performance improvement of the power amplifier compared to FIG. 3 over the entire frequency band.

Low voltage power amplifiers formed in accordance with the present invention can be used in a variety of products including, but not limited to, software definable radios, cellular handsets, and wireless broadband applications.

While shown in a N-channel FET configuration, one skilled in the art appreciates that the hybrid integration of the power amplifier extends to a variety of transistor types, including P-channel FETs and bipolar transistors in which the base transmission line remains part of the amplifier IC and the collector transmission line is integrated into the substrate. While the hybrid structure has been described as preferably using a ceramic substrate, other substrate materials found in amplifier designs, such as those used in high density interconnect (HDI) can also be used.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential features or elements of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

We claim:

1. A distributed power amplifier structure, comprising:
   a substrate;
   an integrated circuit (IC):
   power amplifier circuitry including a plurality of transistors having transmission line inductors coupled thereto; said transistors substantially disposed on said IC and
   said inductors substantially disposed on said substrate, wherein the inductors of the substrate are coupled to the transistors of the IC via wirebonds.

2. A distributed power amplifier structure, comprising:
   a ceramic substrate;
   an integrated circuit (IC) on the ceramic substrates;
   a plurality of transistors each having a drain, gate, and source, the source being coupled to ground, the gate being coupled to a series of gateline transmission inductors; said transistors substantially disposed on said IC;
   a series of drainline transmission inductors; said inductors substantially disposed on said substrate;
   a drainline capacitor coupled to the drain of each transistor; said capacitor substantially disposed on said IC; and
   a wirebond interconnection between each drainline transmission inductor of the ceramic substrate and each drainline capacitor of the IC.

3. The distributed power amplifier structure of claim 2, further comprising:
   an input on the IC; and
   an output taken from the series of drainline transmission inductors, the output coupled to a load.

4. The distributed power amplifier of claim 2, wherein the power amplifier is used in a software definable radio.

5. The distributed power amplifier of claim 2, wherein the power amplifier is used in a cellular handset.

6. The distributed power amplifier of claim 2, wherein the power amplifier is used in a wireless broadband application.

7. The distributed power amplifier of claim 3, wherein the load comprises a balun/transformer integrated on the ceramic substrate.

8. The distributed power amplifier of claim 2, wherein the transistor is an Field Effect Transistor (FET).

9. A distributed power amplifier structure, comprising:
   a substrate;
   an integrated circuit (IC) formed over the substrate, the IC including a first portion of a distributed power amplifier circuit including transistors and a first set of transmission line inductors coupled to the transistors; said transistors and said first set of inductors substantially disposed on said IC: and
   a second set of transmission line inductors substantially disposed on the ceramic substrate, wherein the inductors of the substrate are coupled to the transistors of the IC via wirebond interconnects.

10. The distributed power amplifier structure of claim 9, wherein the substrate is ceramic.

11. The distributed power amplifier structure of claim 9, wherein the substrate is organic.

12. The distributed power amplifier structure of claim 9, wherein the transistors are bipolar transistors.

13. The distributed power amplifier structure of claim 9, wherein the transistors are Field Effect Transistors (FETs).

* * * * *